(12) United States Patent
Stollwerck et al.

(10) Patent No.: US 11,683,880 B2
(45) Date of Patent: Jun. 20, 2023

(54) ENCAPSULATED PRINTED CIRCUIT BOARD ASSEMBLY

(71) Applicant: 3M INNOVATIVE PROPERTIES COMPANY, St. Paul, MN (US)

(72) Inventors: Gunther A. J. Stollwerck, Krefeld (DE); Mark Gravermann, Erkelenz (DE); Jens Weichold, Erkelenz (DE); Sebastian Eggert-Richter, Wülfrath (DE); Michael H. Stalder, Uedem (DE)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 289 days.

(21) Appl. No.: 17/250,905

(22) PCT Filed: Oct. 16, 2019

(86) PCT No.: PCT/IB2019/058838
§ 371 (c)(1),
(2) Date: Mar. 24, 2021

(87) PCT Pub. No.: WO2020/079622
PCT Pub. Date: Apr. 23, 2020

(65) Prior Publication Data
US 2022/0030701 A1 Jan. 27, 2022

(30) Foreign Application Priority Data

Oct. 17, 2018 (EP) ...................................... 8200932

(51) Int. Cl.
*H05K 1/02* (2006.01)
*G01R 1/18* (2006.01)
(Continued)

(52) U.S. Cl.
CPC ............. *H05K 1/0254* (2013.01); *G01R 1/18* (2013.01); *G01R 15/16* (2013.01); *H05K 1/111* (2013.01);
(Continued)

(58) Field of Classification Search
CPC ................................................... H05K 1/0254
(Continued)

(56) References Cited

U.S. PATENT DOCUMENTS 4,935,693 A 6/1990 Falkowski
5,252,913 A 10/1993 Falkowski
(Continued)

FOREIGN PATENT DOCUMENTS

FR 2698695 6/1994
GB 1427766 3/1976
(Continued)

OTHER PUBLICATIONS

Tarzwell, "High Voltage Printed Circuit Design & Manufacturing Notebook", SIERRA Proto Express, Nov. 2004, 36 pages.
(Continued)

*Primary Examiner* — Stanley Tso
(74) *Attorney, Agent, or Firm* — Gregg H. Rosenblatt (57) ABSTRACT

Encapsulated PCB assembly (1) for electrical connection to a high- or medium-voltage power conductor in a power distribution network of a national grid, comprising a) a PCB (10), delimited by a peripheral edge (20) and comprising a high-tension pad (60, 62) on a voltage of at least one kilovolt, b) an electrically insulating encapsulation body (70) in surface contact with, and enveloping, the high-tension pad and at least a portion of the PCB edge adjacent to the high-tension pad, c) a shielding layer (80) on an external surface (90) of the encapsulation body and for being held on electrical ground or on a low voltage to shield at
(Continued)

least a low-voltage portion of the PCB. The high-tension pad extends to the peripheral edge of the PCB.

15 Claims, 5 Drawing Sheets

(51) Int. Cl.
| | |
|---|---|
| *G01R 15/16* | (2006.01) |
| *H05K 1/11* | (2006.01) |
| *H05K 5/06* | (2006.01) |
| *H05K 9/00* | (2006.01) |
| *H05K 1/18* | (2006.01) |

(52) U.S. Cl.
CPC ........... *H05K 5/065* (2013.01); *H05K 9/0007* (2013.01); *H05K 1/181* (2013.01); *H05K 2201/09163* (2013.01); *H05K 2201/10015* (2013.01)

(58) Field of Classification Search
USPC ......................................................... 174/350
See application file for complete search history.

(56) References Cited

U.S. PATENT DOCUMENTS

| | | | |
|---|---|---|---|
| 6,365,960 B1* | 4/2002 | Pollock | H01L 23/552 |
| | | | 257/659 |
| 7,220,915 B1* | 5/2007 | Park | G11C 29/1201 |
| | | | 257/679 |
| 2006/0007624 A1 | 1/2006 | Sundaram | |
| 2013/0133940 A1* | 5/2013 | Chen | H01L 23/552 |
| | | | 29/846 |
| 2013/0193991 A1 | 8/2013 | Handshoe | |
| 2014/0262445 A1 | 9/2014 | Woodward, Jr. | |
| 2015/0194387 A1* | 7/2015 | Yazar | H05K 9/0028 |
| | | | 174/350 |
| 2015/0235757 A1 | 8/2015 | Lovell | |
| 2016/0134094 A1* | 5/2016 | Wentzel | H02G 15/068 |
| | | | 29/857 |

FOREIGN PATENT DOCUMENTS

| | | |
|---|---|---|
| WO | WO 2016-012899 | 1/2016 |
| WO | WO 2018-096567 | 5/2018 |
| WO | WO 2018-229675 | 12/2018 |

OTHER PUBLICATIONS

Extended EP Search Report for EP Application No. 18200932.4, dated Apr. 15, 2019, 2 pages.
International Search Report for PCT International Application No. PCT/IB2019/058838, dated Nov. 13, 2019, 4 pages.

* cited by examiner

ENCAPSULATED PRINTED CIRCUIT BOARD ASSEMBLY

BACKGROUND

The present disclosure relates to encapsulated printed circuit boards in high-voltage or medium-voltage power distribution networks as well as to cable accessories and to networks comprising such encapsulated printed circuit boards.

Sensing the voltage of a power cable in a power distribution network such as a national grid is essential to maintain the network in a stable condition. Suitable voltage sensors often use voltage dividers to sense the voltage of the cable. Certain types of these voltage dividers are electrically connected between the cable on high voltage or medium voltage (collectively referred to as "elevated voltage" herein) and electrical ground or some low voltage. Elements of these voltage dividers, such as resistors or capacitors, are normally arranged on a printed circuit board ("PCB"). Some of these elements are on elevated voltage, and so are conductive traces connecting these elements with each other, and contacts such as soldering contacts connecting these elements with the PCB. Conductive traces and contacts, such as soldering contacts, on a major surface of the PCB, on elevated voltage when in use, are collectively referred to herein as "high-tension pads".

Electrical discharges through air can occur between elements on elevated voltage and elements on electrical ground or on low voltage. To reduce the risk of electrical discharges, PCBs are often encapsulated in a solid, insulating encapsulation body. Such an encapsulation body can be formed, for example, from a liquid resin which flows over the PCB, the elements on elevated voltage as well as the high-tension pads while liquid, and later solidifies to form the encapsulation body.

The outer surface of such an encapsulation body is often coated with a conductive layer for shielding the PCB and the components on it. This shielding layer is mostly held on electrical ground potential, rarely on a low voltage, and in either case a strong electrical field exists between a high-tension pad on elevated voltage and the shielding layer. The smaller the encapsulation body, the closer the shielding layer to the high-tension pad, the stronger the field, and the greater the probability of electrical discharges.

While the high-tension pad is of a conductive material (often metal), and the PCB substrate ("PCB body") is mostly a fiber-reinforced plastic or a ceramic material, the encapsulation body is typically made of a third type of material, often a hardened epoxy resin material or a silicone rubber material. These different materials expand at different rates when heated, so that voids may form between the PCB body and the encapsulation body. The voids are typically filled with air. In their length direction, such voids can extend along the surface of the PCB body, particularly along the PCB edge, and can be quite long, e.g. a few millimetres. In their width direction, i.e. perpendicular to a surface of the PCB body, the voids are smaller, extending only a few micrometres. Where the length direction of such an elongated void is oriented in a direction parallel to the electrical field lines, i.e. away from the high-tension pad towards the shielding layer, the voltage difference between one end of the void and the opposed end of the void can be large enough for a discharge between these ends through the air in the void to become more likely. Such a discharge can damage the PCB assembly and may cause it to fail in the intended use.

In order to reduce the risk of electrical discharges between a high-tension pad and the shielding layer through voids, so-called stress control can be utilized, i.e. means are applied to reduce the concentration of field lines in the vicinity of the high-tension pad. An example of such stress control is described in the U.S. Patent Application US 2006/0007624 A1, where a conducting surface, coupled to a component under electrical stress is provided.

There remains a need, however, to further reduce the likelihood of discharges between a high-tension pad and the shielding layer, i.e. to enhance the voltage robustness of the encapsulated PCB assembly. A more robust PCB assembly may allow to reduce the size of the encapsulation body and to reduce space and weight of the assembly, while maintaining an adequate voltage robustness.

SUMMARY OF THE INVENTION

To further enhance the voltage robustness of an encapsulated PCB in applications with elevated voltage, the present inventors have surprisingly found that electrical discharges are less likely to occur with a specific arrangement of the high-tension pad on the PCB.

The present disclosure therefore provides an encapsulated printed circuit board assembly for electrical connection to a high- or medium-voltage power conductor in a power distribution network of a national grid, the PCB assembly comprising
  a) a printed circuit board (PCB), delimited by a peripheral edge and having a first major surface and an opposed second major surface, and comprising a high-tension pad on the first major surface, wherein in use the high-tension pad is on a voltage of at least one kilovolt,
  b) an electrically insulating encapsulation body in surface contact with, and enveloping, the high-tension pad and at least a portion of the peripheral edge adjacent to the high-tension pad,
  c) a conductive low-voltage shielding layer, arranged on a first surface region of an external surface of the encapsulation body and for being held on electrical ground or on a low voltage to shield at least a low-voltage portion of the PCB, characterized in that the high-tension pad extends to the peripheral edge of the PCB.

Trials have shown that electrical discharges are less likely to occur in encapsulated PCB assemblies, especially after thermal cycling, where the high-tension pad extends to the edge of the PCB. It is speculated that this inventive geometry prevents the formation of longer elongated voids at the edge of the PCB that are oriented lengthwise along the field lines. By positioning the high-tension pad at the edge, or equivalently by removing the PCB substrate material from the original edge of the PCB up to the high-tension pad, field lines between the high-tension pad and the shielding layer do not extend along a surface of the PCB. Long, elongated voids between PCB and encapsulation body potentially formed by thermal cycling can thus not extend lengthwise parallel to the field lines. Absence of such voids results in a reduced likelihood of discharges from the high-tension pad to the low-voltage shielding layer.

The current disclosure relates to PCB assemblies for use with MV or HV power distribution networks. In such networks, electrical power is distributed via HV/MV cables, transformers, switchgears, substations etc. with currents of hundreds of amperes and voltages of tens of kilovolts. The term "medium voltage" or "MV" as used herein refers to an AC or DC voltage in the range of 1 kV to 72 kV, whereas the term "high voltage" or "HV" refers to an AC or DC voltage of more than 72 kV. Medium voltage and high voltage are collectively referred to herein as "elevated voltage".

Power conductors are elements in a power distribution network which conduct power over a certain distance, such as buried or aerial power cables or busbars or switches in switchgears or transformers of the power distribution network. Power conductors are designed to transmit power at voltages of 1 kV or more and at currents of 10 Amperes or more.

A printed circuit board for use according to the present disclosure can generally be any PCB of the many types that exist. The PCB comprises a substrate, also referred to as a PCB body. Electrical elements, such as soldering contacts, conductive traces, or electrical or electronic components like e.g. capacitors, resistors, inductances, or integrated circuits (ICs), may be arranged on the body, i.e. on an accessible major surface of the body, or in the body. In particular, the PCB body may have different degrees of flexibility, i.e. the PCB body may be a rigid PCB body or a flexible PCB body.

The PCB body may be made of different materials, for example, the PCB body may be a ceramic PCB body or a PCB body comprising a ceramic material. However, the PCB body may be made of, or comprise, more conventional materials like FR4 or other fibre-reinforced materials. In certain advantageous embodiments of the present encapsulated PCB assembly the PCB comprises a ceramic material, such as alumina or aluminium nitride.

The PCB body may be a single-layer PCB body, or it may comprise a plurality of layers, e.g. such as to form a multilayer PCB. In a multilayer PCB, electrical elements, e.g. conductive traces, may be arranged in the PCB body between two adjacent layers of the multilayer PCB body.

The PCB may comprise a number of discrete impedance elements, such as discrete capacitors, discrete resistors or discrete inductors, electrically connected in series with each other to form a voltage divider, or a portion of a voltage divider, for sensing a voltage of the power conductor to which the PCB assembly of the current disclosure can be connected. The discrete impedance elements may be arranged linearly in configuration of a chain ("divider chain"), such as in a straight chain or in a meandering chain. A first end of the chain of discrete impedance elements can be electrically connected to the power conductor on elevated voltage. A second, opposed end of the chain of discrete impedance elements can be electrically connected to electrical ground or to an element on low voltage.

In certain embodiments, the PCB comprises a plurality of discrete capacitors, electrically connected in series with each other to form a voltage divider for sensing an AC voltage of the power conductor to which the PCB assembly of the current disclosure can be connected.

A capacitive voltage divider is a proven and cost-effective means to divide the elevated voltage of the power conductor. A capacitive voltage divider can be used in a voltage-dividing voltage sensor to sense the elevated voltage versus electrical ground. Therefore, in certain embodiments, and independently from features of other embodiments, the encapsulated PCB assembly according to the present disclosure further comprises a plurality of discrete capacitors, arranged on the PCB and electrically connected in series with each other such as to be operable as a voltage divider for sensing an elevated voltage of the high- or medium-voltage power conductor.

A PCB has two opposed parallel major surfaces, and its extension in thickness direction is normally much smaller than its extension along the major surfaces. The PCB and the PCB body is delimited by a peripheral edge. This edge forms the outer border of the major surfaces.

In certain embodiments of the PCB assembly described herein the peripheral edge may have extra protrusions or recesses to provide a longer path for leakage currents along the peripheral edge. Such extra protrusions or recesses may be particularly useful if arranged in the vicinity of the high-tension pad or in the vicinity of any or all high-tension pads.

Conductive traces and contacts, such as soldering contacts, on a major surface of the PCB, which are on elevated voltage when in use, are collectively referred to herein as "high-tension pads". In particular, soldering contacts on the first major surface which provide electrical connection and mechanical attachment of electrical elements on the PCB, and which are on elevated voltage when in use, are referred to as high-tension pads. In the context of the present disclosure, the term "high tension" refers to high electrical potential, not to mechanical stress. A high-tension pad may be, for example, a soldering contact or a soldering pad, or a conductive trace on a major surface of the PCB connecting two electrical components.

In the thickness direction of the PCB, high-tension pads do not extend much over the major surface on which they are arranged, i.e. their thickness is small. High-tension pads may, for example, have a thickness of less than the thickness of the PCB body, or they may have a thickness of less than 2 mm, or less than 1 mm. Certain preferred high-tension pads may have a thickness of between 35 µm (micrometers) and 200 µm. Thickness is measured perpendicularly to the portion of the major surface of the PCB on which the high-tension pad is arranged.

In directions along the major surface, high-tension pads may have a size of a fraction of a square millimetre up to several square centimetres or an even larger size.

The shape of a high-tension pad, in the plane of the major surface on which it is arranged, is not particularly limited. A high-tension pad may have, for example, a generally circular shape, an elliptical shape, a square shape, a rectangular shape, a triangular shape, or a hexagonal shape. A high-tension pad may have an irregular shape. In certain preferred embodiments, a high-tension pad has a rectangular shape with an aspect ratio of about 2:1, i.e. the long side of the rectangle being about twice as long as the short side. In embodiments where the high-tension pad has a shape of a polygon (e.g. of a square, rectangle, triangle, hexagon, etc.) the corners of the polygon may be rounded. This helps avoid concentration of field lines at a corner and thereby further reduces the risk of discharges.

In certain embodiments, one or all of the high-tension pads have a rectangular shape, in which the corners are rounded at a radius that is equal to half the length of the short side of the rectangle. These high-tension pads have a rectangular shape in which the short sides form a respective semicircle. In other embodiments, one or all of the high-tension pads have a rectangular shape, in which the corners are rounded at a radius that is less than half the length of the short side of the rectangle, e.g. less than 50%, less than 40%, 30%, 20% or less than 10% of the length of the short side of the rectangle.

Independent of the shape of the peripheral edge of the PCB (e.g. generally straight or having protrusions or recesses as described below), it is generally desirable that the high-tension pad not only extends to the peripheral edge of the PCB, but also extends along the peripheral edge for a certain distance. A high-tension pad extends along the peripheral edge for a distance, if the peripheral edge of the PCB and the peripheral boundary of the high-tension pad coincide for that distance, which is measured along their common edge. In preferred embodiments the high-tension pad extends along the peripheral edge for a distance of 1 mm or more, 3 mm or more, 5 mm or more, or more than 10 mm.

Where a PCB as described herein comprises the high-tension pad and at least one further high-tension pad, each high-tension pad of this plurality of high-tension pads may have the same shape. Alternatively, they may have different shapes. Independent of the shape of the high-tension-pad, any further high-tension pad may have a shape as described herein.

In some embodiments a high-tension pad on the first major surface of the PCB extends to the second major surface. The high-tension pad then comprises a portion on the first major surface, and another portion on the second major surface.

The electrical connection between the portion on the first major surface and the portion on the second major surface can be established in at least two different ways: through the PCB or via the edge of the PCB. The portion of the high-tension pad on the first major surface may be electrically connected to the portion on the second major surface by a conductively plated through-hole through the PCB, a so-called "via". Alternatively, the two portions may be electrically connected by a conductive trace extending from the first major surface around the peripheral edge of the PCB to the second major surface.

Hence generally, in certain embodiments, the high-tension pad extends to the second major surface via a conductive trace formed through the PCB or via a conductive trace formed around the peripheral edge.

In certain embodiments of the encapsulated PCB assembly according to the present disclosure the high-tension pad extends to the peripheral edge on the first major surface exclusively. In other embodiments the high-tension pad extends to the peripheral edge on the second major surface. In others of these embodiments the high-tension pad extends to the peripheral edge on the first major surface and on the second major surface.

The function of the encapsulation body is to reduce the risk of electrical discharges between elements of the PCB on elevated voltage, such as high-tension pads or electric or electronic components on elevated voltage, and elements of the PCB on ground or on a low voltage. Its function may also be to reduce the risk of discharges between elements of the PCB on elevated voltage and other elements on ground or on low voltage, such as a grounded shielding layer of the PCB assembly or a grounded outer layer of the power conductor. A second function is to provide mechanical stability to the PCB assembly and to provide protection of the PCB, of the high-tension pad and of the electrical components supported by the PCB against mechanical, chemical, physical or generally environmental impacts.

The encapsulation body is electrically insulating. The encapsulation body may be made from, or comprise, a material that has a relative permittivity of 1.5 or higher, of at least 2, at least 3, or at least 5. Generally, the relative permittivity of the material forming, or comprised in, the encapsulation body may be higher than the relative permittivity of air.

In certain embodiments, the encapsulation body is formed, e.g. by molding, from a curable liquid resin which solidifies upon curing to form the encapsulation body. In certain embodiments the encapsulation body comprises a solidified resin, such as a solidified epoxy resin, a polyurethane resin, or comprises a solidified silicone rubber.

In certain of these embodiments, the encapsulation body is formed, e.g. by molding, from a liquid resin which flows over the PCB, over the elements on elevated voltage as well as over the high-tension pads while liquid, and which later solidifies to form the encapsulation body.

The encapsulation body may be in surface contact with at least a portion of the PCB and with at least a portion of the high-tension pad. In some embodiments, the encapsulation body is in surface contact with a portion of the PCB and with the high-tension pad.

In certain embodiments, the encapsulation body encapsulates (i.e. envelopes) a portion of the PCB. In certain of these embodiments, the encapsulation body encapsulates the entire PCB. The encapsulation body may encapsulate the entire PCB and the entire high-tension pad. Wires may be connected to contacts on the PCB for electrically connecting the PCB to the MV/HV power conductor and/or to electrical ground or a lower voltage, and/or to a processing unit. The processing unit may process a signal voltage generated on the PCB, indicative of the voltage of the power conductor versus ground, and thereby sense the voltage of the power conductor.

The shape of the encapsulation body is not particularly limited. Advantageously the shape of the encapsulation body corresponds to the shape of the PCB. For example, where the PCB has an elongated straight shape, the encapsulation body may have an elongated straight shape.

Generally, a smaller size of the encapsulation body saves space and reduces the amount of encapsulation material required. However, in a smaller encapsulation body the low-voltage shielding layer on the external surface of the encapsulation body is generally closer to the high-tension pad, which results in a stronger electrical field between the pad and the shielding layer, creating a higher risk of discharges. Hence, in certain embodiments, the encapsulation body is shaped such that the distance between any portion of the high-tension pad and any portion of the low-voltage shielding layer is at least 2 mm, at least 3 mm, at least 5 mm or at least 10 mm.

In a PCB assembly according to the present disclosure, the high-tension pad extending to the peripheral edge of the PCB reduces the risk of discharges, so that the encapsulation body can be smaller. Hence in certain embodiments, the geometrical distance between any portion of the high-tension pad and the closest portion of the external surface of the encapsulation body is twenty millimetres (mm) or less, 10 mm or less, 5 mm or less or even 4 mm or less. Where the elevated voltage is about 12 kV, the geometrical distance between any portion of the high-tension pad and the closest portion of the external surface of the encapsulation body is advantageously about 5 mm or less.

In many embodiments, the encapsulation body has an elongated shape. The elongated shape defines a length direction of the encapsulation body. Where the PCB has an elongated shape defining a length direction of the PCB, the PCB may be arranged in the encapsulation body such that the length direction of the PCB is parallel to the length direction of the encapsulation body.

In certain embodiments, the encapsulation body is shaped such that its external surface has the same cross section everywhere along its length. In certain embodiments the outer shape of the encapsulation body is cylindrical. In certain embodiments, the encapsulation body is shaped such that its external surface has an oval cross section, a circular or an elliptical cross section along its length. However, the encapsulation body may alternatively have an irregular shape.

The encapsulation body may be rigid, e.g. of elongated shape and rigid. Alternatively, the encapsulation body may be flexible. In most embodiments, the flexibility of the encapsulated PCB assembly, i.e. of the PCB encapsulated in the encapsulation body, is less than the flexibility of the PCB alone, measured under the same conditions and in the same direction. Flexibility can be measured, for example, by determining the elasticity module.

During years of use, a PCB assembly according to the present disclosure may undergo variations in its temperature. Where the body of the PCB and the encapsulation body have considerably different coefficients of thermal expansion, changes in temperature can cause gaps and subsequent air voids between the PCB body and the encapsulation body. Such air voids in a strong electric field, can cause electrical discharges that eventually damage or destroy the PCB assembly.

It is therefore advantageous to manufacture the PCB body and the encapsulation body from materials that have similar coefficients of thermal expansion. Hence, in certain embodiments of the present PCB assembly, the encapsulation body comprises a solidified first material having a first coefficient of thermal expansion at 20° C., and the PCB comprises a PCB body consisting of a second material having a second coefficient of thermal expansion at 20° C., the first and the second coefficient being determined under the same conditions and using the same method, wherein the first coefficient of thermal expansion differs from the second coefficient of thermal expansion by 50% or less of the value of the first coefficient of thermal expansion.

It may be advantageous to express the coefficients of thermal expansion in parts per million ($1/10^6$) change in length per Kelvin of temperature change, abbreviated as "ppm/K". Therefore, in certain embodiments, the encapsulation body comprises a solidified first material having a first coefficient of thermal expansion at 20° C., expressed in ppm/K, and the PCB comprises a PCB body consisting of a second material having a second coefficient of thermal expansion at 20° C., also expressed in ppm/K, the first and the second coefficient being determined under the same conditions and using the same method, wherein the first coefficient of thermal expansion differs from the second coefficient of thermal expansion by 40 ppm/K or less.

A PCB assembly according to the present disclosure comprises a conductive low-voltage shielding layer, arranged on a first surface region of an external surface of the encapsulation body. In use, the low-voltage shielding layer is held on electrical ground or on a low voltage and shields the PCB and the high-tension pad. Low voltage, in the context of this application, refers to a voltage of 100 Volt or less, AC.

As will be described below, the PCB assembly may further comprise a second shielding layer, namely an elevated-voltage shielding layer, arranged on a second surface region of the external surface of the encapsulation body. The first surface region and the second surface region do not overlap, i.e. the first surface region and the second surface region are disjunct surface regions of the external surface of the encapsulation body.

In some embodiments of the present encapsulated PCB assembly, the low-voltage shielding layer or any portion of it is, or comprises, a coating, e.g. a vapour-deposited coating or a painted layer, on an external surface of the encapsulation body. In other embodiments, the low-voltage shielding layer is, or comprises, a conductive foil wrapped around at least a portion of the external surface of the encapsulation body.

Independent of the properties of the low-voltage shielding layer, in certain embodiments also the elevated-voltage shielding layer or any portion of it is, or comprises, a coating, e.g. a vapour-deposited coating, or a painted layer on an external surface of the encapsulation body. In other embodiments, the elevated-voltage shielding layer is, or comprises, a conductive foil wrapped around an external surface of the encapsulation body.

The low-voltage shielding layer or portions of it may be continuous or discontinuous. A discontinuous layer (portion) may be patterned, i.e. it might have a plurality of non-conductive voids. The voids may occupy up to 50% of the surface area of the low-voltage shielding layer. Similarly, also the elevated-voltage shielding layer or portions of it may be continuous or discontinuous. A discontinuous layer (portion) may be patterned, i.e. it might have a plurality of non-conductive voids. The voids may occupy up to 50% of the surface area of the elevated-voltage shielding layer.

The low-voltage shielding layer is conductive. It may consist of, or comprise, a conductive material such as copper, silver, gold, aluminium, or another conductive metal. In certain embodiments, the low-voltage shielding layer comprises a conductive polymer. In a specific embodiment, the low-voltage shielding layer comprises an epoxy containing graphite. In a different embodiment, the low-voltage shielding layer comprises a conductive silicone paint or a conductive silicone lacquer. In a specific embodiment, the low-voltage shielding layer comprises a mesh of conductive wires.

Where the PCB assembly comprises an elevated-voltage shielding layer, the elevated-voltage shielding layer is conductive. It may consist of, or comprise, a conductive material such as copper, silver, gold, aluminium, or another conductive metal. In certain embodiments, the elevated-voltage shielding layer comprises a conductive polymer. In a specific embodiment, the elevated-voltage shielding layer comprises an epoxy containing graphite. In a different embodiment, the elevated-voltage shielding layer comprises a conductive silicone paint or a conductive silicone lacquer. In a specific embodiment, the elevated-voltage shielding layer comprises a mesh of conductive wires.

In certain embodiments, the low-voltage shielding layer is arranged on only a first portion of the external surface of the encapsulation body. A second portion, e.g. the remainder, of the external surface of the encapsulation body may remain free of any shielding layer. In certain preferred embodiments, the low-voltage shielding layer is arranged on a first portion of the external surface of the encapsulation body, wherein the first portion envelopes the entire PCB and the high-tension pad. In other preferred embodiments, in which electrical or electronic elements are arranged on the PCB, the low-voltage shielding layer is arranged on a first portion of the external surface of the encapsulation body, wherein the first portion envelopes the electrical or electronic elements on the PCB.

A need may arise to provide the second, elevated-voltage shielding layer, for example because the printed circuit board assembly of the present disclosure may form a voltage divider, or a part of a voltage divider, for sensing the voltage of the power conductor. In such a voltage divider, a plurality of discrete impedance elements, electrically connected in series with each other between the elevated voltage of the power conductor and ground or low voltage to divide the elevated voltage, may be arranged on the PCB. Preferably, these voltage-dividing discrete impedance elements are arranged linearly on the PCB in a chain-like configuration, forming a chain of divider elements or a "divider chain" on the PCB. An elevated-voltage end of the divider chain may be electrically connected to the power conductor, and a low-voltage end of the divider chain may be electrically connected to ground or to a low voltage.

In a voltage divider chain, discrete impedance elements at the elevated-voltage end and the high-tension pads for connecting these discrete impedance elements with each other and with the PCB are on a higher voltage than the discrete impedance elements and the high-tension pads for connecting these discrete impedance elements with each other and with the PCB at the low-voltage end, because the elevated voltage is divided down by the divider chain, so that the respective voltage decreases from one end of the chain to the other end.

Apart from forming a linear voltage divider, there may be other reasons to arrange electrical elements on elevated voltage on a first portion of the PCB (the elevated-voltage portion of the PCB), and arrange electrical elements on low voltage or on ground on a second portion of the PCB (the low-voltage portion of the PCB).

In an attempt to reduce parasitic currents between the discrete impedance elements or their high-tension pads and the shielding layer, it has been found that it may be advantageous to split the shielding layer into two conductive portions, separated by an intermediate insulating gap on the external surface of the encapsulation body. Hence, in certain preferred embodiments of the present disclosure, the low-voltage shielding layer is applied on the external surface of the encapsulation body such as to envelope the low-voltage portion of the PCB, and is held on electrical ground or on a low voltage, and an elevated-voltage shielding layer is applied on the external surface of the encapsulation body such as to envelope the elevated-voltage portion of the PCB, and is held on high voltage.

As a result, the electrical elements on the low-voltage portion of the PCB are shielded by a low-voltage shielding layer on electrical ground or on low voltage, which reduces voltage differences and parasitic currents between electrical elements in that low-voltage portion of the PCB and the low-voltage shielding layer. Similarly, the electrical elements on the elevated-voltage portion of the PCB are shielded by an elevated-voltage shielding layer on elevated voltage, which also reduces voltage differences and parasitic currents between electrical elements in that elevated-voltage portion of the PCB and the elevated-voltage shielding layer. The low-voltage shielding layer and the elevated-voltage shielding layer are not applied above each other, but side-by-side on separate surface regions of the external surface of the encapsulation body. An intermediate surface region of the external surface of the encapsulation body enveloping the PCB, namely a surface region enveloping an intermediate portion of the PCB between the elevated-voltage portion and the low-voltage portion of the PCB, is not provided with a shielding layer. This unshielded gap is necessary to avoid electrical discharges between the elevated-voltage shielding layer and the low-voltage shielding layer.

So generally, in certain embodiments of the PCB assembly according to the present disclosure, the encapsulated PCB assembly further comprises a conductive elevated-voltage shielding layer, arranged on a second surface region of the external surface of the encapsulation body, for being held on an elevated voltage to shield at least an elevated-voltage portion of the PCB, wherein the first and the second surface regions are separated by a third surface region, electrically insulating and free of an electrically conductive layer, arranged between the first surface region and the second surface region, for insulating the elevated-voltage shielding layer from the low-voltage shielding layer.

The elevated-voltage shielding layer may be arranged and sized such as to form a conductive envelope around the elevated-voltage portion of the PCB. The low-voltage shielding layer may be arranged and sized such as to form a conductive envelope around the low-voltage portion of the PCB.

In a specific embodiment, in which the PCB has an elongate shape and is entirely enveloped by the encapsulation body, and in which the low-voltage portion and the elevated-voltage portion of the PCB are arranged at opposed end portions of the PCB, the elevated-voltage shielding layer is arranged on a first surface region of the external surface of the encapsulation body such as to envelope the elevated-voltage portion of the PCB. The low-voltage shielding layer is arranged on a second surface region of the external surface of the encapsulation body such as to envelope the low-voltage portion of the PCB. The first and the second surface regions are separated by a third surface region, electrically insulating and free of an electrically conductive layer, arranged between the first and the second surface regions, for insulating the elevated-voltage shielding layer from the low-voltage shielding layer.

In use, a strong electrical field exists between an edge portion of the low-voltage shielding layer adjacent to one side the third surface region, and an edge portion of the elevated-voltage shielding layer adjacent to the opposite side the third surface region. To reduce the risk of electrical discharges between these edge portions, the distance between them may be made larger, thereby increasing the size of the third surface region. Alternatively, the third surface region can be provided with an electrically insulating envelope. This envelope may be rigid. In this case it may be made, for example, of a further hardened resin. Alternatively, the envelope may be elastic, in which case it may, for example, be made of an insulating rubber material.

Generally, the insulating envelope may be arranged on the third surface region, but optionally also on the low-voltage shielding layer or a portion of it. Similarly, the insulating envelope may be arranged on the third surface region, but optionally also on the elevated-voltage shielding layer or a portion of it. The insulating envelope may be arranged on the third surface region, but optionally also on the low-voltage shielding layer or a portion of it and the elevated-voltage shielding layer or a portion of it. In certain embodiments, the insulating envelope may be arranged on the entire surface of the encapsulation body.

So generally, in certain embodiments at least a portion of the encapsulation body is enveloped by a rigid or elastic, electrically insulating encapsulating envelope, arranged on at least the third surface region.

Where a further reduction of electrical stress between opposed edges of the low-voltage shielding layer and the elevated-voltage shielding layer is desired, the edges can be shaped to form geometric stress control surfaces. To that end, the shielding layers may extend onto the encapsulating envelope. The portions of the envelope supporting the respective edges of the shielding layers may be shaped such that the opposed edges are shaped suitably for geometric stress control.

Where the encapsulation body has an elongated shape, this shape defines length directions and radial directions orthogonal to the length directions. The low-voltage shielding layer and the elevated-voltage shielding layer may be spaced from each other in length direction. The encapsulating envelope may then extend radially from the third surface portion, so that surface areas of the envelope may support the respective opposing edge portions of the shielding layers. These surface areas of the envelope may be shaped such that the opposed edge portions of the shielding layers extend in radial directions and have a convex shape. The convex shape refers to the central portions of the opposed edge portions being closer to each other than portions arranged radially more outwardly. In other words, seen from one edge portion, the opposite edge portion has a convex shape. This convex shape may be useful for geometric stress control between the shielding layers.

Hence, in certain embodiments, the elevated-voltage shielding layer extends onto a first surface portion of the encapsulating envelope, and wherein the low-voltage shielding layer extends onto a second surface portion of the encapsulating envelope, and each of the first surface portion and the second surface portion are shaped such as to reduce electrical stress between the elevated-voltage shielding layer and the low-voltage shielding layer. Suitable geometric stress control shapes are well known or can be found in standard textbooks.

It has been found to reduce the risk of electrical discharges starting from the high-tension pad, if electrical field lines originating from the high-tension pad, extend less along exposed portions (i.e. portions not covered by the high-tension pad) of a major surface of the PCB. In other words: A high-tension pad is advantageously arranged on a protrusion of the peripheral edge of the PCB and extends to the peripheral edge of the protrusion.

Describing the same geometry in another way, a high-tension pad on a non-recessed portion of the peripheral edge is advantageously arranged next to a recessed portion of the peripheral edge of the PCB and extends to the peripheral edge in the non-recessed portion and in the recessed portion.

Therefore, in certain embodiments of the PCB assembly according to the present disclosure, the peripheral edge comprises, in the plane of the PCB, a recessed portion and a non-recessed portion, connected with each other by a recessing portion, and the high-tension pad extends to the peripheral edge in the non-recessed portion and to the peripheral edge in the recessing portion.

It is particularly advantageous to provide a recess of the peripheral edge between two adjacent high-tension pads on the first major surface. Where both adjacent high-tension pads extend "sideways" (i.e. in a direction generally along the peripheral edge) up to the recess, the one recess helps reduce the risk of discharges originating from either of the adjacent high-tension pads.

Therefore, in certain embodiments, the PCB as described above comprises a second high-tension pad on the first major surface, adjacent to the (first) high-tension pad and extending to the peripheral edge of the PCB, wherein in use the second high-tension pad is on a voltage of at least one kilovolt, and the peripheral edge comprises a recess, the recess being arranged between the first and the second high-tension pad.

In certain embodiments, the peripheral edge of the PCB comprises a recess, arranged between two adjacent high-tension pads, and the two adjacent high-tension pads extend to the recess.

In certain embodiments, which are particularly cost-effective to manufacture, the recess has a rectangular shape, a square shape, a triangular shape, a semi-circular shape, or a trapezoidal shape.

For reducing the risk of an electrical discharge effectively, a recess in the peripheral edge preferably has a width (i.e. an extension measured in the large-scale general direction of the peripheral edge) of at least one millimetre (mm), at least 2 mm, at least 3 mm or at least 5 mm. Where the elevated voltage is about 12 kV, and where the recess is arranged between a first and a second high-tension pad, a recess preferably has a width of at least 3 mm.

Hence, in certain advantageous embodiments, the recess has a rectangular shape, defined by a recessed portion of the peripheral edge and two opposed parallel recessing portions of the peripheral edge, wherein a width of the recess, measured as the length of the shortest straight line between the recessing portions, is one millimetre or more.

For further reducing the risk of an electrical discharge effectively, a recess in the peripheral edge preferably has a depth (i.e. an extension measured orthogonally to the large-scale general direction of the peripheral edge) of one millimetre (mm) or more, 2 mm or more, 3 mm or more, or 5 mm or more. Where the elevated voltage is about 12 kV, and where the recess is arranged between a first and a second high-tension pad, the depth of the recess is preferably 2 mm or more.

Hence, in certain advantageous embodiments, the recess has a rectangular shape, defined by a recessed portion of the peripheral edge and two opposed parallel recessing portions of the peripheral edge, wherein a depth of the recess, measured orthogonally to the large-scale general direction of the peripheral edge, is one millimetre or more.

Where the PCB assembly forms a voltage divider, or a portion of a voltage divider, for sensing an elevated voltage of the MV/HV power conductor, a plurality of discrete impedance elements (i.e. discrete capacitors, discrete resistors, discrete inductors) may be arranged on the PCB and be electrically connected in series with each other such as to be operable as a voltage divider. These impedance elements may be connected to the PCB by further soldering contacts, so that the PCB comprises more than one high-tension pad. Where an elevated voltage of about 12 kV is to be sensed, ten or more discrete impedance elements on elevated voltage may be used. In some useful embodiments, the PCB has six or more high-tension pads which are on a voltage of 1 kV or higher. Advantageously all of them extend to the peripheral edge of the PCB. For a reduced risk of electrical discharge, each of these high-tension pads is covered by the encapsulation body.

Therefore, in certain embodiments the PCB of the encapsulated PCB assembly comprises at least five further high-tension pads on the first major surface, each of the further high-tension pads being on a voltage of at least one kilovolt when in use, and extending to the peripheral edge of the PCB, wherein the encapsulation body is in surface contact with, and envelops, each of the further high-tension pads.

An encapsulated PCB assembly as described herein can be used as a component of a cable accessory for a HV/MV power cable as used in power distribution networks in national grids. Such cable accessories may be, for example, cable terminations, cable splices, or pluggable connectors such as elbow plugs or T-shaped connectors used with switchgears and transformers. Such cable accessories typically comprise an insulating sleeve for placement around the power cable, where the cable may be partially stripped to expose the central conductor. In order to accommodate the PCB assembly, the accessory may have a cavity in the insulating sleeve.

The insulating sleeve may be, or may comprise, an electrically insulating rubber material such as, for example, an insulating synthetic or natural rubber, such as EPDM rubber (ethylene propylene diene monomer rubber) or a silicone-containing rubber. The insulating sleeve may be an elastic sleeve. It may be elastically expandable or radially shrinkable. Certain insulating sleeves may be elastic and radially shrinkable.

The present disclosure therefore also provides a cable accessory for use on a high- or medium voltage power cable in a power distribution network of a national grid, comprising an insulating sleeve having a) a receiving space for receiving a section of the power cable such that the sleeve surrounds the power cable, and b) a cavity containing a PCB assembly as described herein.

The present disclosure also provides a power distribution network comprising a high- or medium-voltage power conductor and an encapsulated PCB assembly as described herein, electrically connected to the power conductor. In such networks, the encapsulated PCB assembly as described herein may be useful to facilitate voltage sensing on the power conductor, which allows for closer control of the network performance, greater safety in network operation, and hence higher network availability and/or enhanced network performance.

BRIEF DESCRIPTION OF THE DRAWINGS

The PCB assembly according to the present disclosure will now be described in more detail with reference to the following Figures exemplifying particular embodiments of the disclosure. In some Figures, certain dimensions and/or thicknesses are drawn exaggerated for greater clarity.

DETAILED DESCRIPTION

Figure 1:
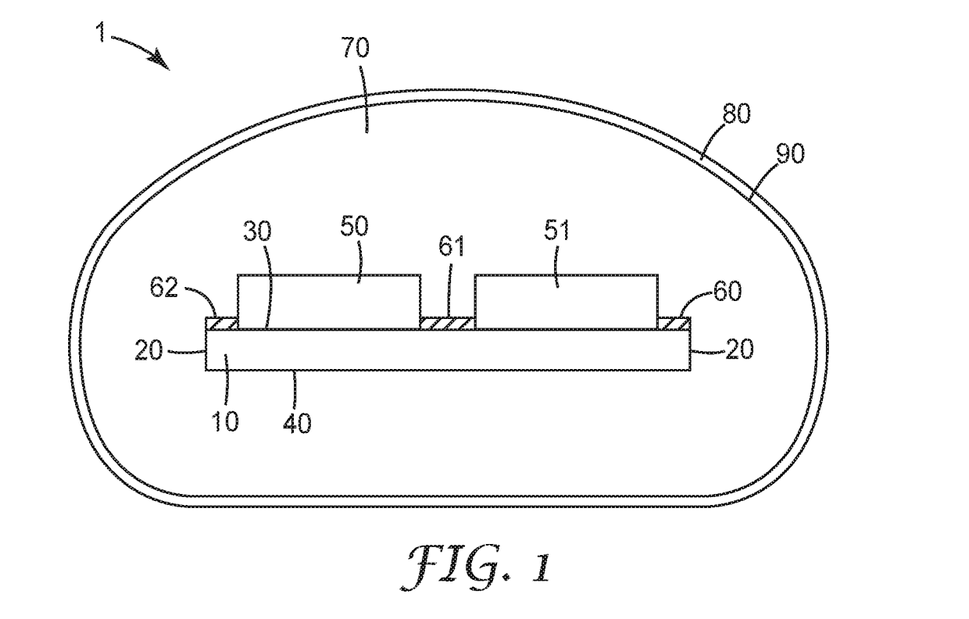
FIG. 1 Cross section of a first PCB assembly according to the present disclosure.

FIG. 1 illustrates, in a cross-sectional view, a first PCB assembly 1 according to the present disclosure. The first PCB assembly 1 comprises a PCB 10 having a first major surface 30 and an opposed second major surface 40. The PCB 10 is delimited by a peripheral edge 20. The PCB 10 supports a plurality of electrical and electronic components 50, 51 on its first major surface 30, of which only two are visible in FIG. 1. These components 50, 51 are discrete capacitors 50, 51, electrically connected in series with each other to form a voltage divider, or a portion of a voltage divider, for sensing a voltage of a power conductor to which the PCB assembly 1 can be electrically connected.

The discrete capacitor 51 is attached to the first surface 30, and electrically connected to other elements, by soldering at two soldering pads 60, 61. Similarly, the discrete capacitor 50 is attached to the first surface 30, and electrically connected to other elements, by soldering at two soldering pads 61, 62. The soldering pads 60, 61, 62 are on an elevated voltage of several kilovolts (kV) when in use, therefore they are also referred to as "high-tension pads" 60, 61, 62 herein. The high-tension pads 60, 62 next to the peripheral edge 20 of the PCB 10 extend up to the peripheral edge 20. Thereby no portion of the first major surface 30 between the respective high-tension pad 60, 62 and (the closest portion of) the edge 20 is exposed.

The PCB 10, including the electrical and electronic components 50, 51 and the high-tension pads 60, 61, 62, is encapsulated in an electrically insulating encapsulation body 70, which is in surface contact with the PCB 10, the high-tension pads 60, 61, 62 and the electrical and electronic components 50, 51. The encapsulation body 70 envelopes the PCB 10, the high-tension pads 60, 61, 62 and the electrical and electronic components 50, 51 on all sides.

An electrically conductive shielding layer 80 is arranged on the external surface 90 of the encapsulation body 70. The shielding layer 80 is held on electrical ground to shield the PCB 10, the high-tension pads 60, 61, 62 and the electrical and electronic components 50, 51.

Figure 2:
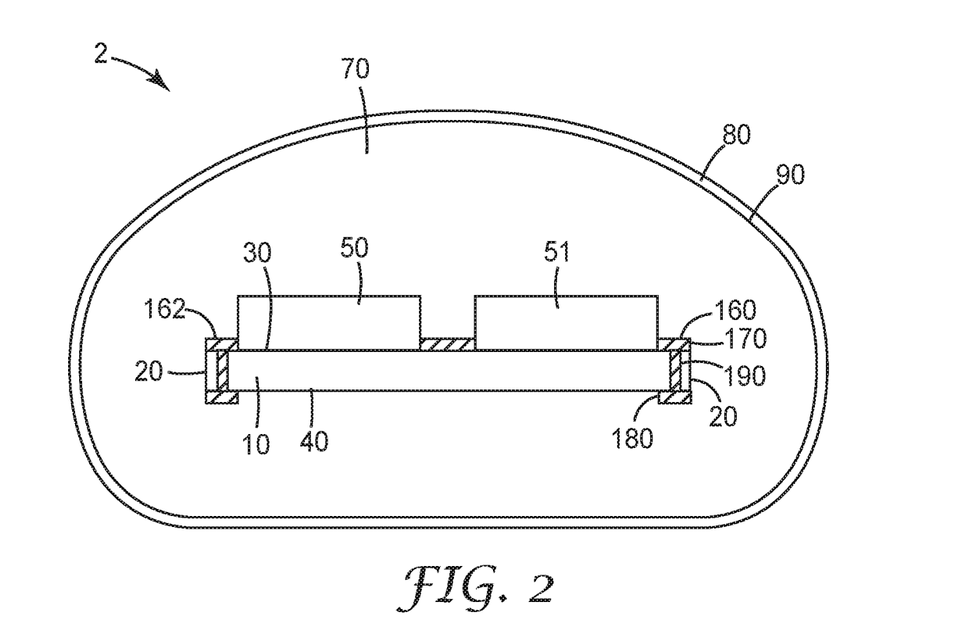
FIG. 2 Cross section of a second PCB assembly according to the present disclosure.

A second PCB assembly 2 according to the present disclosure is illustrated, in a cross-sectional view, in FIG. 2. The second PCB assembly 2 is identical with the first PCB assembly 1 shown in FIG. 1, except for the high-tension pads 160, 162 next to the peripheral edge 20 of the PCB 10. The high-tension pad 160 of the second PCB assembly 2 extends from the first surface 30 through the PCB 10 to the second surface 40. An upper portion 170 of the high-tension pad 160 is arranged on the first major surface 30, a lower portion 180 is arranged on the second major surface 40, and a conductive trace 190, namely a via portion 190, electrically connects the upper portion 170 with the lower portion 180 through the PCB 10 in the thickness direction of the PCB 10. The upper portion 170 of the high-tension pad 160 covers a portion of the first surface 30 next to the edge 20 and extends, on the first surface 30, to the peripheral edge 20 of the PCB 10. The lower portion 180 covers a portion of the second surface 40 next to the peripheral edge 20 and also extends, on the second surface 40, to the edge 20 of the PCB 10.

Figure 3:
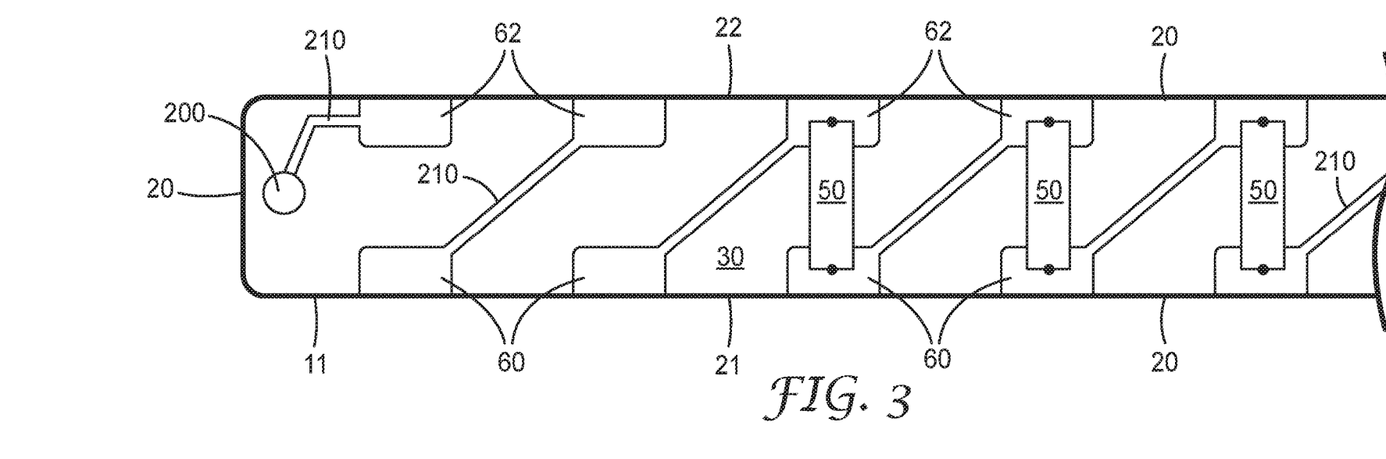
FIG. 3 Top view of a third PCB for a third PCB assembly according to the present disclosure.

FIG. 3 illustrates in a top view an end portion of a third PCB 11 of a third PCB assembly according to the present disclosure. The encapsulation body and its shielding layer are not shown. The third PCB 11 is similar to the PCB 10 of the first PCB assembly 1, except that it carries only a single row of discrete capacitors 50, which are electrically connected in series to form a capacitive voltage divider for sensing an elevated voltage of a MV/HV power conductor.

On the left-hand side of the PCB 11, it comprises a high-voltage contact 200 for connecting the PCB 11 to the power conductor on elevated voltage. Conductive traces 210 on the first major surface 30 of the PCB 11 connect the high-voltage contact 200 to the discrete capacitors 50, and the discrete capacitors 50 with adjacent capacitors 50 to form a chain of dividing capacitors 50 which can be operated in a voltage divider for sensing the elevated voltage of the power conductor.

The PCB 11 has soldering pads 60, 62, also termed high-tension pads 60, 62, for connecting the discrete capacitors 50 to the PCB 11. The high-tension pads 60, 62 are arranged in two linearly rows. The high-tension pads 60 of a first row are arranged on a straight first portion 21 of the peripheral edge 20, the high-tension pads 62 of a second row are arranged on an opposed straight second portion 22 of the peripheral edge 20 such that a pair of two high-tension pads 60, 62 are arranged opposite to each other on the first major surface 30. The capacitors 50 are soldered between two opposite high-tension pads 60, 62, namely between one high-tension pad 60 of the first row and an opposed high-tension pad 62 of the second row.

For clarity, only three capacitors 50 are shown soldered to the PCB 11 on the right-hand side of FIG. 3, while the two leftmost pairs of high-tension pads 60, 62 are shown before a capacitor 50 is soldered between them.

Each of the high-tension pads 60, 62 extends to the peripheral edge 20 of the PCB 11, similar to what is shown in the cross section of FIG. 1 for the PCB 10 in the first PCB assembly 1.

The PCB 11 shown in FIG. 3, after connecting the missing two capacitors 50 to the two leftmost pairs of high-tension pads 60, 62, can later be encapsulated in an encapsulation body that is in surface contact with the high-tension pads 60, 62, with the exposed portions of the first major surface 30 and of the opposed second major surface 40 of the PCB 11, and with the capacitors 50. A wire can electrically connect the high-voltage contact 200 with the power conductor.

Figure 4:
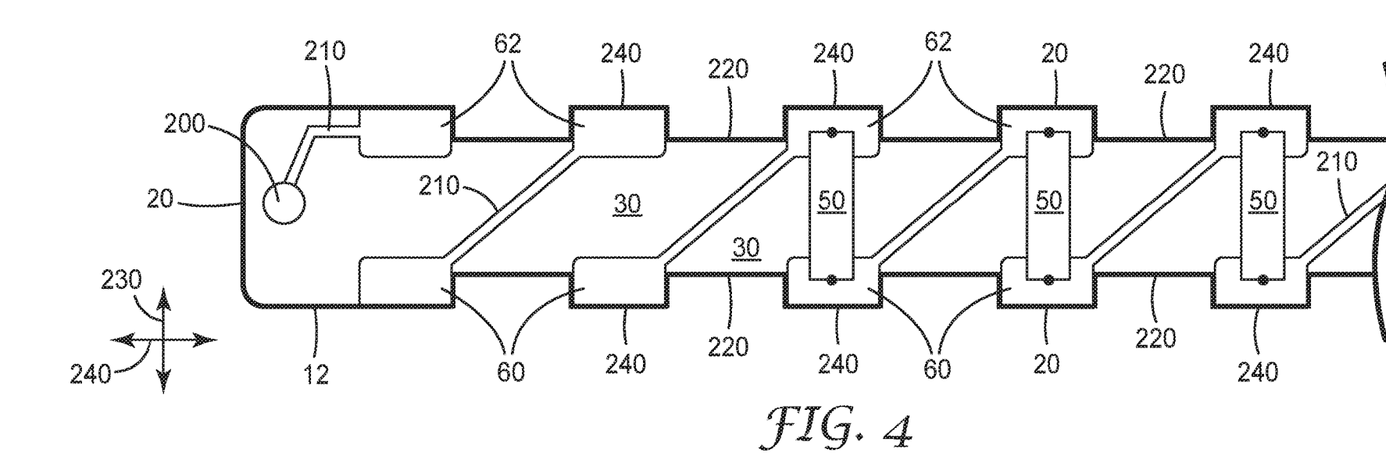
FIG. 4 Top view of a fourth PCB for a fourth PCB assembly according to the present disclosure.

A similar PCB 12 is illustrated in FIG. 4, in a top view. This fourth PCB 12 is identical to the third PCB 11 of FIG. 3, except that its peripheral edge 20 comprises edge recesses 220 between two respective neighbouring non-recessed portions 240. Each of the non-recessed portions 240 supports a high-tension pad 60, 62 on the non-recessed portion 240 of the peripheral edge 20. The high-tension pads 60, 62 are arranged on the non-recessed portions 240 and extend to the peripheral edge 20. The edge recesses 220 extend laterally (i.e. in length direction of the PCB 12) up to the high-tension pads 60, 62, so that the high-tension pads 60, 62 extend up to the peripheral edge in the recess 220. The depth of a recess 220, i.e. its extension in width direction 230 of the PCB 12, is chosen such that it is about 50% of the depth (extension in width direction 230 of the PCB 12) of the high-tension pad 60, 62.

The same geometry may alternatively also be described such that the peripheral edge 20 comprises edge protrusions 240 in the plane of the PCB 12, carrying high-tension pads 60, 62. The high-tension pads 60, 62, extend up to the peripheral edge 20 of the edge protrusions 240. The extension of a protrusion 240 in width direction 230 of the PCB 12, is chosen such that about 50% of the depth (extension in width direction 230 of the PCB 12) of the high-tension pad 60, 62 is arranged on the protrusion 240.

It is currently believed that the provision of recesses 220 in the peripheral edge 20 between neighbouring high-tension pads 60, 62 reduces the risk of electrical discharges between the high-tension pads 60, 62 and the shielding layer 80 due to the fact that less electrical field lines from a high-tension pad 60, 62 towards the shielding layer 80 pass over an exposed surface of the first major surface 30 of the PCB 12. The encapsulation body 70 filling the recesses 220 between neighbouring high-tension pads 60, 62 appears to reduce risk of discharge, compared to portions of the PCB body filling the recesses 220.

Figure 5:
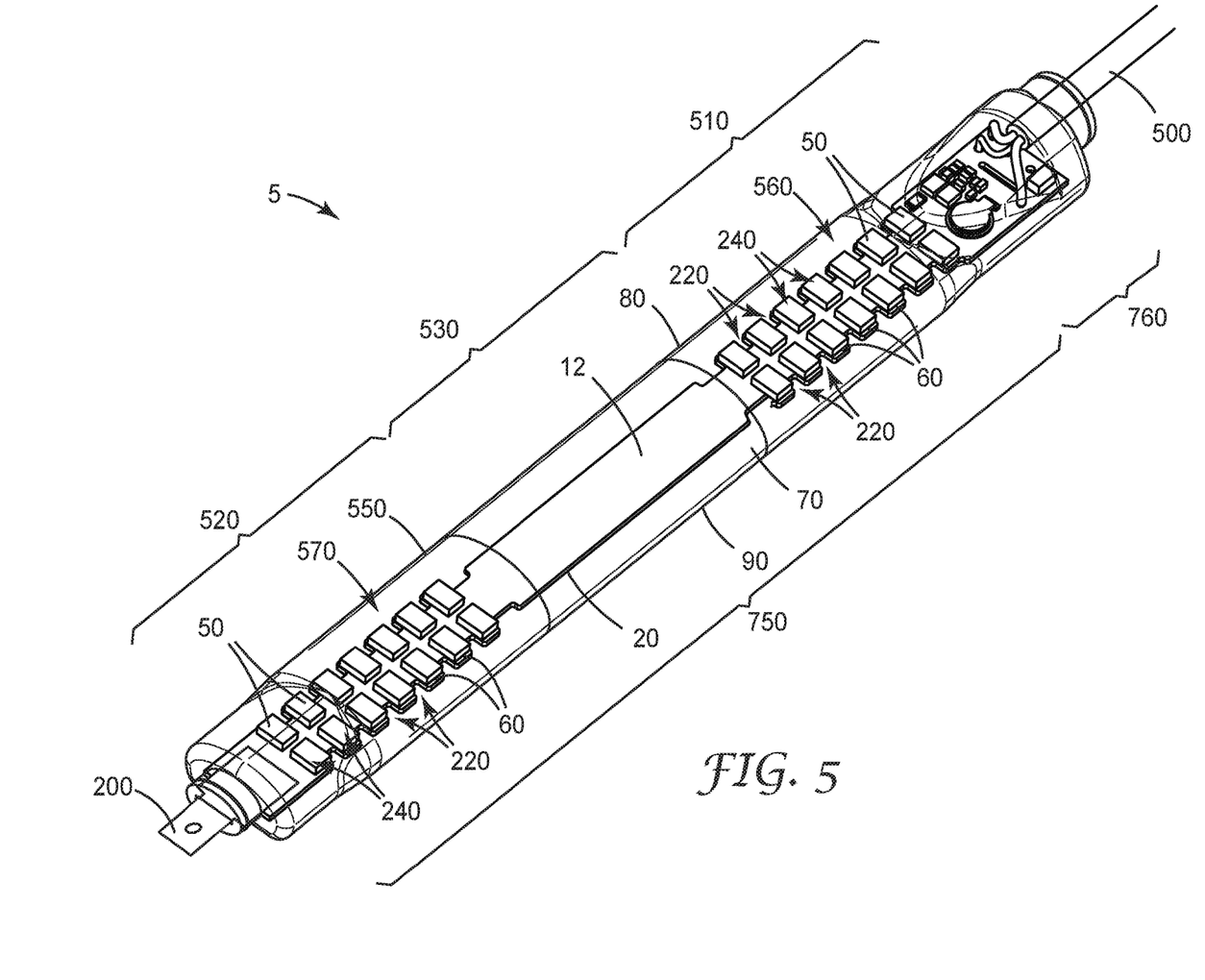
FIG. 5 Perspective view of a fifth PCB assembly according to the present disclosure.

FIG. 5 illustrates a fifth PCB assembly 5 according to the present disclosure in a perspective view. The PCB assembly 5 has an elongated shape and comprises a PCB 12, which is similar to the PCB 12 of FIG. 4, its peripheral edge 20 comprising recesses 220 between two respective neighbouring non-recessed portions 240, and with the high-tension pads 60 on the first surface 30 being arranged on the non-recessed portions 240 and extending up to the peripheral edge 20.

Figure 7:
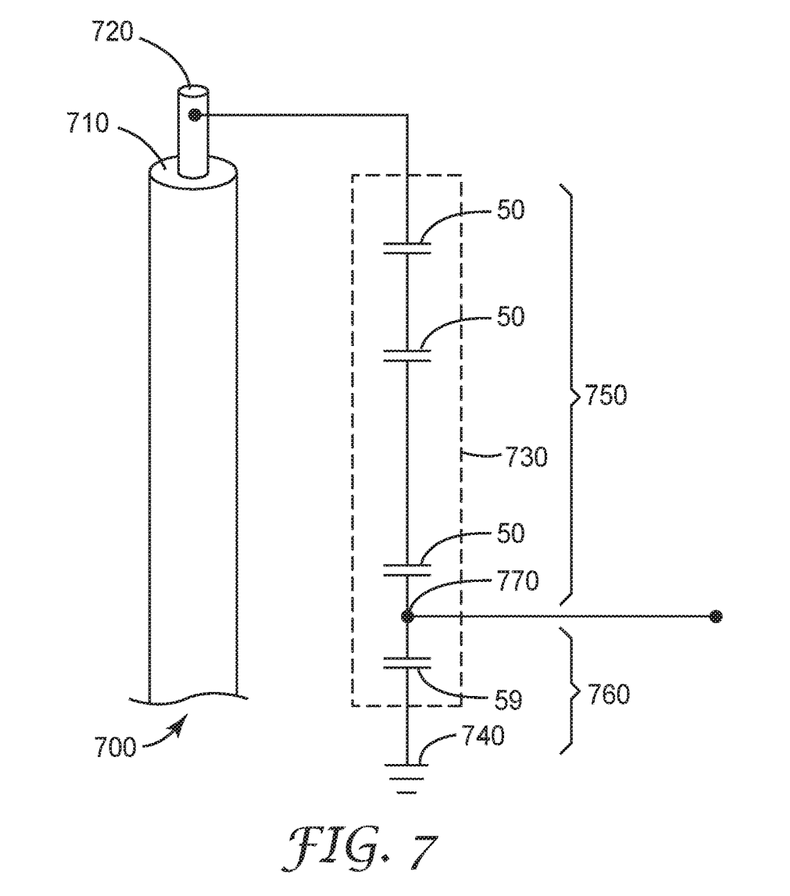
FIG. 7 Circuit diagram of a voltage-dividing voltage sensor, connected to a HV/MV power conductor.

The PCB 12 supports twenty-eight discrete capacitors 50, arranged in two parallel rows and electrically connected in series to be operable as a voltage divider for sensing an elevated voltage of a power conductor 700 (shown in FIG. 7) to which the PCB assembly 5 can be connected via a high-voltage contact 200. The capacitors 50 are attached to the PCB 12 at the high-tension pads 60. With reference to FIG. 7, the capacitors 50 form the high-voltage side 750 of the voltage divider, while the low-voltage side 760 is arranged at an end portion of the PCB 12. Wires for connection to electrical ground and for transmitting the signal voltage to an external processing unit are led through a cable 500 to outside the PCB assembly 5.

The PCB 12 is encapsulated in an electrically insulating encapsulation body 70 of a hardened resin, which is in surface contact with the capacitors 50, the high-tension pads 60 and the peripheral edge 20 of the PCB 12. In FIG. 5, the encapsulation body 70 is drawn transparent for greater clarity. It may, however, be transparent, translucent or opaque, as required.

The external surface 90 of the encapsulation body 70 comprises three surface regions which are arranged side-by-side and adjacent to their neighbouring surface region: A first surface region 510 is provided with a conductive low-voltage shielding layer 80, a second surface region 520 is provided with a conductive elevated-voltage shielding layer 550, and a third surface region 530, which is free of a conductive layer, is arranged between the first surface region 510 and the second surface region 520 and separates these surface regions 510, 520.

The first surface region 510 and the second surface region 520 are electrically insulated from each other by the third surface region 530. In use, the low-voltage shielding layer 80 and the elevated-voltage shielding layer 550 are held on different voltages: The low-voltage shielding layer 80 is held on electrical ground, while the elevated-voltage shielding layer 550 is held on the elevated AC voltage of the power conductor. This latter is achieved by protrusions of the high-voltage contact 200 extending, inside the encapsulation body 70, to the external surface 90 of the encapsulation body 70 to be in contact with the elevated-voltage shielding layer 550.

Both the elevated-voltage shielding layer 550 and the low-voltage shielding layer 80 are formed by a conductive paint, applied on the first surface region 510 and the second surface region 520, respectively. Again, the shielding layers 80, 50 are drawn transparent for clarity only, and may in fact be transparent, translucent or opaque.

The low-voltage shielding layer 80 envelopes and thereby shields those discrete capacitors 50 that are on a low-voltage portion 560 of the PCB 12. Correspondingly, the elevated-voltage shielding layer 550 envelopes and thereby shields those discrete capacitors 50 that are on an elevated-voltage portion 570 of the PCB 12.

The PCB assembly 5 shown in FIG. 5 has a generally elliptical cross section, a length of about 20 cm and a width of about 2.5 cm. The extension in length direction of the third surface region 530 is about 5 cm.

Figure 6:
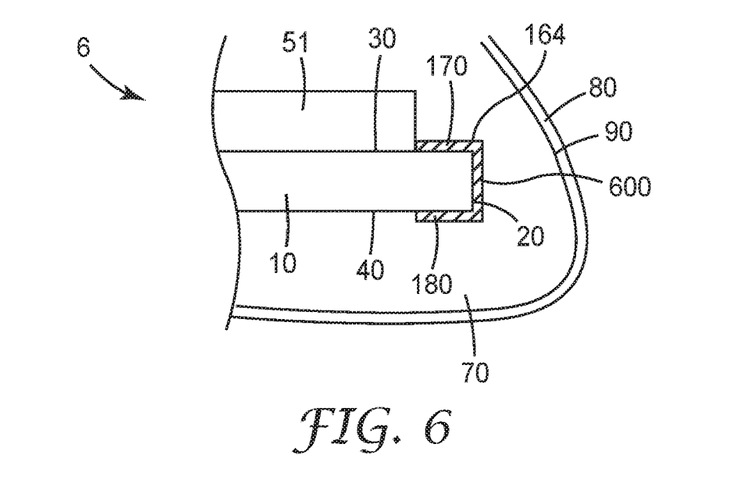
FIG. 6 Partial Cross section of a sixth PCB assembly according to the present disclosure.

FIG. 6 illustrates, in a cross-sectional view, a portion of a sixth PCB assembly 6 according to the present disclosure. The sixth PCB assembly 6 is identical to the second PCB assembly 2 shown in FIG. 2, except that the lower portion 180 of the high-tension pad 164 is electrically connected to the upper portion 170 by an edge-covering portion 600 instead of a via portion 190. Both the upper portion 170 on the first major surface 30 and the lower portion 180 on the second major surface 40 extend to the peripheral edge 20 of the PCB 10. The edge-covering portion 600 of the high-tension pad 164 is formed by an electrically conductive trace extending between the upper portion 170 and the lower portion 180 around the edge 20, i.e. over the edge surface.

FIG. 7 is a sketched circuit diagram for illustrating the use of an encapsulated PCB assembly according to the present disclosure. A medium-voltage power cable 700 is shown, in a perspective view, with its insulation layer 710 partially removed so that the central conductor 720 is exposed. The cable 700 is an example of a power conductor 700 in a power distribution network of a national grid. In use the central conductor 720 is on an elevated AC voltage of tens of kilovolt and can conduct currents of tens of amperes. According to the circuit diagram in the right part of FIG. 7, a voltage divider 730 is electrically connected between the elevated voltage of the central conductor 720 and ground 740.

The voltage divider 730 comprises a plurality of discrete dividing capacitors 50, electrically connected in series with each other such that the voltage divider 730 can sense the elevated voltage of the power cable 700. The capacitors 50, connected to the elevated voltage, form a high-voltage side 750 of the voltage divider 730, the low-voltage side 760 being formed by a single discrete capacitor 59. A pickup contact 770 is connected electrically between the high-voltage side 750 and the low-voltage side 760. A divided voltage can be picked up at the pickup contact 770, which varies proportionally to the voltage of the power cable 700. The proportionality factor between the elevated voltage and the divided voltage is determined by the ratio of the total impedances of the high-voltage side 750 and of the low-voltage side 760. By determining the divided voltage at the pickup contact 770, the elevated voltage of the power cable 700 can be sensed.

The encapsulated PCB assemblies 1, 2, 5, 6, 7 disclosed herein may comprise the entire voltage divider 730 (as shown by the dashed box in FIG. 7), or alternatively only the high-voltage side 750 of the voltage divider 730. The dividing capacitors 50 may be arranged on the PCB 10, as shown, for example, in FIG. 1.

Figure 8:
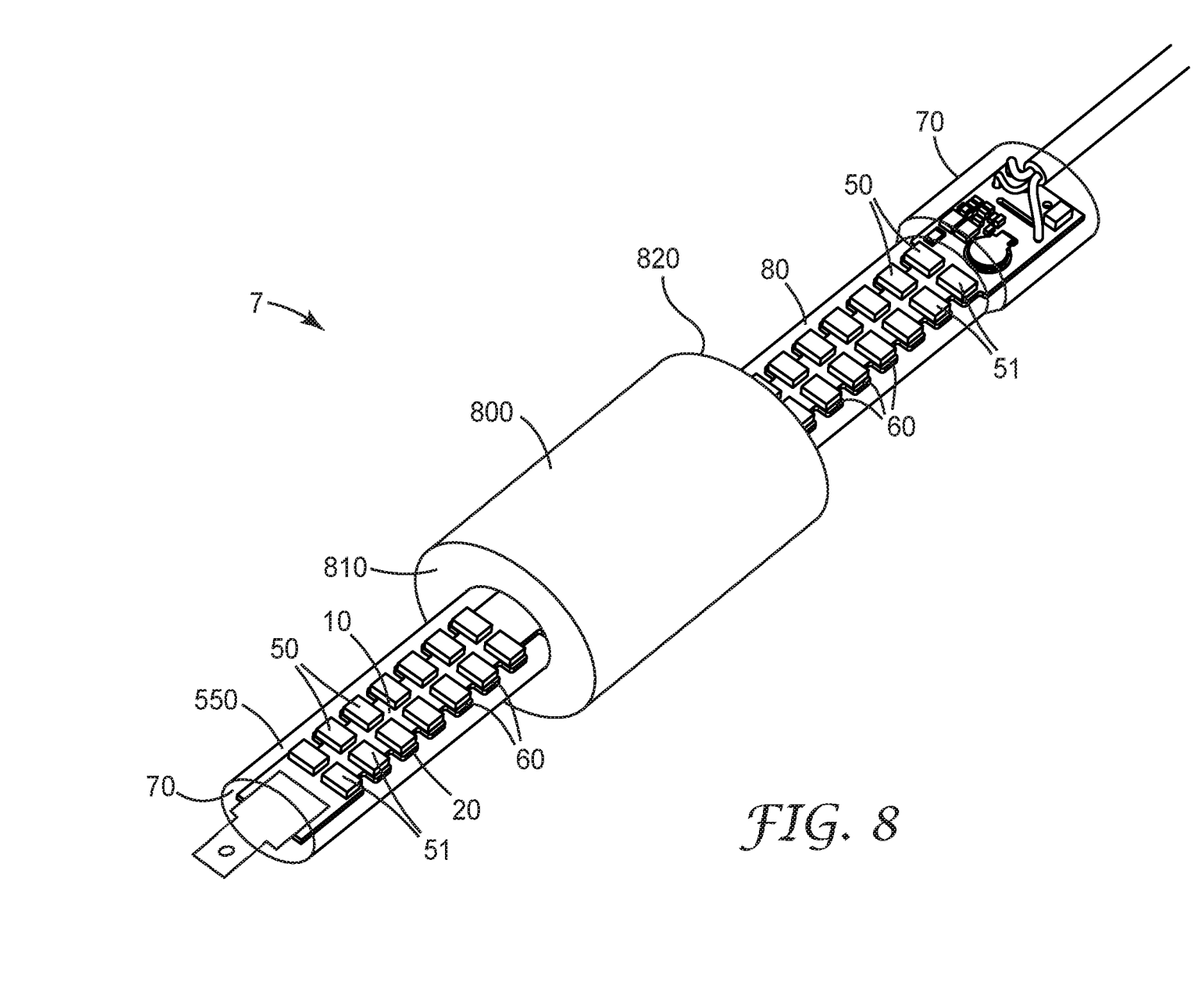
FIG. 8 Perspective view of a seventh PCB assembly according to the present disclosure, comprising an encapsulating envelope.

FIG. 8 illustrates, in a perspective view, a seventh PCB assembly 7 in accordance with the present disclosure. The PCB 10 is similar to the PCB 10 shown in FIG. 1 and has high-tension pads 60 extending to the peripheral edge 20 of the PCB 10. The PCB 10 is encapsulated in an encapsulation body 70, which is drawn as if it were transparent. An elevated-voltage shielding layer 550 is arranged on a first surface region of the encapsulation body 70, and a low-voltage shielding layer 80 is arranged on a second surface region of the encapsulation body 70. A third surface region is arranged between the first and the second surface region. It is not visible, because a rigid, electrically insulating encapsulating envelope 800 is arranged on it. It is made of a hardened resin and insulates the low-voltage shielding layer 80 from the elevated-voltage shielding layer 550 from each other better than air would insulate them from each other, thereby reducing the risk of electrical discharges between the shielding layers 80, 550.

The envelope 800 has a generally cylindrical shape with a three-dimensionally curved first end face 810 and an opposed end face 820 which is similarly shaped. Its end faces 810, 820 are not flat, but each of them has a convex shape. The end portion of the low-voltage shielding layer 80 extends on the second end face 820 and covers all of the end face 820, so that the end portion of the low-voltage shielding layer 80 has the convex shape of the second end face 820 of the envelope 800. Similarly, the end portion of the elevated-voltage shielding layer 550 extends onto the first end face 810 of the envelope 800 and covers the entire first end face 810, so that the end portion of the elevated-voltage shielding layer 550 has the convex shape of the first end face 810 of the envelope 800. The opposed convex shapes of the shielding layers 80, 550 form a geometric stress control assembly and help reduce the risk of discharges between the opposed portions. The opposed end portions of the respective shielding layers 80, 550 are thus shaped to reduce electrical stress between them.

The invention claimed is:

1. Encapsulated printed circuit board assembly for electrical connection to a high- or medium-voltage power conductor in a power distribution network of a national grid, the printed circuit board assembly comprising:
    a) a printed circuit board, delimited by a peripheral edge and having a first major surface and an opposed second major surface, and comprising a high-tension pad, on the first major surface, wherein in use the high-tension pad is on a voltage of at least one kilovolt,
    b) an electrically insulating encapsulation body in surface contact with, and enveloping, the high-tension pad and at least a portion of the peripheral edge adjacent to the high-tension pad,
    c) a conductive low-voltage shielding layer, arranged on a first surface region of an external surface of the encapsulation body and for being held on electrical ground or on a low voltage to shield at least a low-voltage portion of the PCB,
    wherein the high-tension pad extends to the peripheral edge of the PCB.

2. PCB assembly according to claim 1, wherein the peripheral edge comprises, in the plane of the PCB, a recessed portion and a non-recessed portion, connected with each other by a recessing portion, and wherein the high-tension pad extends to the peripheral edge in the non-recessed portion and to the peripheral edge in the recessing portion.

3. PCB assembly according to claim 1, wherein the PCB comprises a second high-tension pad on the first major surface, adjacent to the (first) high-tension pad and extending to the peripheral edge of the PCB, wherein in use the second high-tension pad is on a voltage of at least one kilovolt, and wherein the peripheral edge comprises a recess, the recess being arranged between the first and the second high-tension pad.

4. PCB assembly according to claim 3, wherein the recess has a rectangular shape, a square shape, a triangular shape, a semi-circular shape, or a trapezoidal shape.

5. PCB assembly according to claim 4, wherein the recess has a rectangular shape, defined by a recessed portion of the peripheral edge and two opposed parallel recessing portions of the peripheral edge, wherein a width of the recess, measured as the length of the shortest straight line between the recessing portions, is one millimetre or more.

6. PCB assembly according to claim 1, wherein the high-tension pad extends to the second major surface via a conductive trace (190) formed through the PCB or via a conductive trace formed around the peripheral edge.

7. PCB assembly according to claim 6, wherein the high-tension pad extends to the peripheral edge on the second major surface.

8. PCB assembly according to claim 1, further comprising a plurality of discrete capacitors, arranged on the PCB and electrically connected in series with each other such as to be operable as a voltage divider for sensing an elevated voltage of the high- or medium-voltage power conductor.

9. PCB assembly according to claim 1, wherein the geometrical distance between any portion of the high-tension pad and the closest portion of the external surface of the encapsulation body is twenty millimetres or less.

10. PCB assembly according to claim 1, wherein the encapsulation body comprises a solidified first material having a first coefficient of thermal expansion at 20° C., and wherein the PCB comprises a PCB body consisting of a second material having a second coefficient of thermal expansion at 20° C., the first and the second coefficient being determined under the same conditions and using the same method, wherein the first coefficient of thermal expansion differs from the second coefficient of thermal expansion by 50% or less of the value of the first coefficient of thermal expansion.

11. PCB assembly according to claim 1, further comprising a conductive elevated-voltage shielding layer, arranged on a second surface region of the external surface of the encapsulation body, for being held on an elevated voltage to shield at least an elevated-voltage portion of the PCB;

wherein the first and the second surface regions are separated by a third surface region, electrically insulating and free of an electrically conductive layer, arranged between the first surface region and the second surface region, for insulating the elevated-voltage shielding layer from the low-voltage shielding layer.

12. PCB assembly according to claim 11, wherein at least a portion of the encapsulation body is enveloped by a rigid or elastic, electrically insulating encapsulating envelope, arranged on at least the third surface region.

13. PCB assembly according to claim 12, wherein the elevated-voltage shielding layer extends onto a first surface portion of the encapsulating envelope, and wherein the low-voltage shielding layer extends onto a second surface portion of the encapsulating envelope, and wherein each of the first surface portion and the second surface portion are shaped such as to reduce electrical stress between the elevated-voltage shielding layer and the low-voltage shielding layer.

14. Cable accessory for use on a high- or medium voltage power cable in a power distribution network of a national grid, comprising an insulating sleeve having
   a) a receiving space for receiving a section of the power cable such that the sleeve surrounds the power cable, and
   b) a cavity containing an encapsulated PCB assembly according to claim 1.

15. Power distribution network comprising a high- or medium-voltage power conductor and an encapsulated PCB assembly according to claim 1, electrically connected to the power conductor.

* * * * *

UNITED STATES PATENT AND TRADEMARK OFFICE
CERTIFICATE OF CORRECTION

PATENT NO. : 11,683,880 B2
APPLICATION NO. : 17/250905
DATED : June 20, 2023
INVENTOR(S) : Gunther Stollwerck et al.

Page 1 of 1

It is certified that error appears in the above-identified patent and that said Letters Patent is hereby corrected as shown below:

In the Claims

Column 18
Line 16, In Claim 1, insert --(PCB)-- after "printed circuit board".

Signed and Sealed this
Twenty-third Day of January, 2024

Katherine Kelly Vidal
*Director of the United States Patent and Trademark Office*